US010114585B2

(12) United States Patent
Chu et al.

(10) Patent No.: US 10,114,585 B2
(45) Date of Patent: Oct. 30, 2018

(54) TRANSACTION ELIMINATION USING METADATA

(71) Applicant: QUALCOMM Incorporated, San Diego, CA (US)

(72) Inventors: Jeffrey Hao Chu, San Diego, CA (US); Subrato Kumar De, San Diego, CA (US); Dexter Tamio Chun, San Diego, CA (US); Bohuslav Rychlik, San Diego, CA (US); Richard Alan Stewart, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 100 days.

(21) Appl. No.: 15/448,203

(22) Filed: Mar. 2, 2017

(65) Prior Publication Data
US 2018/0253258 A1 Sep. 6, 2018

(51) Int. Cl.
*G06F 3/06* (2006.01)
*G06F 13/16* (2006.01)

(52) U.S. Cl.
CPC ............ *G06F 3/0656* (2013.01); *G06F 3/061* (2013.01); *G06F 3/0673* (2013.01); *G06F 13/1673* (2013.01); *G06F 3/0625* (2013.01)

(58) Field of Classification Search
CPC ...... G06F 3/061; G06F 3/0625; G06F 3/0656; G06F 3/0673; G06F 13/1673
See application file for complete search history.

(56) References Cited

U.S. PATENT DOCUMENTS

| 3,210,739 | A  | 10/1965 | Davies |
| 6,189,083 | B1 | 2/2001 | Snyder, II |
| 9,406,155 | B2 | 8/2016 | Oterhals et al. |
| 2009/0077329 | A1 | 3/2009 | Wood et al. |

(Continued)

FOREIGN PATENT DOCUMENTS

WO WO-2016059423 A1 4/2016

OTHER PUBLICATIONS

International Search Report and Written Opinion—PCT/US2018/018543—ISA/EPO—dated May 11, 2018.

(Continued)

*Primary Examiner* — Aracelis Ruiz
(74) *Attorney, Agent, or Firm* — Patterson & Sheridan, L.L.P

(57) ABSTRACT

Various aspects are described herein. In some aspects, the present disclosure provides a method of communicating data between an electronic unit of a system-on-chip (SoC) and a dynamic random access memory (DRAM). The method includes initiating a memory transaction corresponding to first data. The method includes determining a non-unique first signature and a unique second signature associated with the first data based on content of the first data. The method includes determining if the non-unique first signature is stored in at least one of a local buffer on the SoC separate from the DRAM or the DRAM. The method includes determining if the unique second signature is stored in at least one of the local buffer or the DRAM based on determining the non-unique first signature is stored. The method includes eliminating the memory transaction with respect to the DRAM based on determining the unique second signature is stored.

30 Claims, 10 Drawing Sheets

(56) References Cited

U.S. PATENT DOCUMENTS

2011/0074765 A1* 3/2011 Oterhals ................ G06T 11/40
710/52
2011/0080419 A1  4/2011 Croxford et al.
2015/0212151 A1  7/2015 Picalausa et al.
2016/0014009 A1  1/2016 Jain et al.

OTHER PUBLICATIONS

Fedorova A., et al., "Maximizing Power Efficiency with Asymmetric Multicore Systems," Communications of the ACM, vol. 52, No. 12, Dec. 2009, pp. 48-57.

* cited by examiner

TRANSACTION ELIMINATION USING METADATA

TECHNICAL FIELD

The teachings of the present disclosure relate generally to transmission of data over buses and in particular embodiments to eliminating bus transactions for data based on metadata associated with the data.

INTRODUCTION

An integrated circuit (e.g., SoC) may utilize on chip bus interconnections between electronic units (EU), which reside on the integrated circuit. Accordingly, EUs on integrated circuits may be coupled to each other by buses. A "bus" may include a signal conductor or a plurality of conductors used to couple EUs and transfer data (e.g., bits) between EUs. An "electronic unit" may include electronic circuitry, which is coupled to other electronic circuitry by one or more buses. For example, an EU may be a microprocessor, a computer, a floating point co-processor, a graphics processing unit (GPU), an intellectual property (IP) core, processing unit, memory, controller, etc. An EU may be coupled to another EU by a data bus.

A SoC may include a plurality of EUs coupled by one or more buses. Such interconnected systems may resemble a quilt with different fabric pieces interconnected by stitches, hence a common term to describe such an interconnected system is "fabric."

Reduction of power consumption is a common goal for electronic systems. For example, transmission of data across buses between components of the electronic system may consume power. Reducing such power consumed in the transmission of data across buses may therefore reduce power consumption overall in the electronic system. For example, reducing the power utilized for transmission of data over buses in system-on-chip (SoC) applications, may reduce the overall power consumed by the SoC.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In some aspects, the present disclosure provides a method of communicating data between an electronic unit (EU) of a system-on-chip (SoC) and a dynamic random access memory (DRAM). The method includes initiating a memory transaction corresponding to first data. The method includes determining a non-unique first signature associated with the first data based on content of the first data. The method includes determining a unique second signature associated with the first data based on content of the first data. The method includes determining if the non-unique first signature is stored in at least one of a local buffer on the SoC separate from the DRAM or the DRAM. The method includes determining if the unique second signature is stored in at least one of the local buffer or the DRAM based on determining the non-unique first signature is stored. The method includes eliminating the memory transaction with respect to the DRAM based on determining the unique second signature is stored.

In some aspects, the present disclosure provides a system-on-chip (SoC) including a local buffer and an electronic unit configured to access the local buffer. The electronic unit is configured to initiate a memory transaction corresponding to first data. The electronic unit is configured to determine a non-unique first signature associated with the first data based on content of the first data. The electronic unit is configured to determine a unique second signature associated with the first data based on content of the first data. The electronic unit is configured to determine if the non-unique first signature is stored in at least one of the local buffer on the SoC separate from a dynamic random access memory (DRAM) or the DRAM. The electronic unit is configured to determine if the unique second signature is stored in at least one of the local buffer or the DRAM based on determining the non-unique first signature is stored. The electronic unit is configured to eliminate the memory transaction with respect to the DRAM based on determining the unique second signature is stored.

In some aspects, the present disclosure provides a system-on-chip (SoC). The SoC includes means for initiating a memory transaction corresponding to first data. The SoC includes means for determining a non-unique first signature associated with the first data based on content of the first data. The SoC includes means for determining a unique second signature associated with the first data based on content of the first data. The SoC includes means for determining if the non-unique first signature is stored in at least one of a local buffer on the SoC separate from a dynamic random access memory (DRAM) or the DRAM. The SoC includes means for determining if the unique second signature is stored in at least one of the local buffer or the DRAM based on determining the non-unique first signature is stored. The SoC includes means for eliminating the memory transaction with respect to the DRAM based on determining the unique second signature is stored.

In some aspects, the present disclosure provides a non-transitory computer-readable medium that when executed by at least one processor causes the at least one processor to perform a method of communicating data between an electronic unit (EU) of a system-on-chip (SoC) and a dynamic random access memory (DRAM). The method includes initiating a memory transaction corresponding to first data. The method includes determining a non-unique first signature associated with the first data based on content of the first data. The method includes determining a unique second signature associated with the first data based on content of the first data. The method includes determining if the non-unique first signature is stored in at least one of a local buffer on the SoC separate from the DRAM or the DRAM. The method includes determining if the unique second signature is stored in at least one of the local buffer or the DRAM based on determining the non-unique first signature is stored. The method includes eliminating the memory transaction with respect to the DRAM based on determining the unique second signature is stored.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Although the teachings of this disclosure are illustrated in terms of integrated circuits (e.g., a SoC), the teachings are applicable in other areas. The teachings disclosed should not be construed to be limited to SoC designs or the illustrated embodiments. The illustrated embodiments are merely vehicles to describe and illustrate examples of the inventive teachings disclosed herein.

Figure 1:
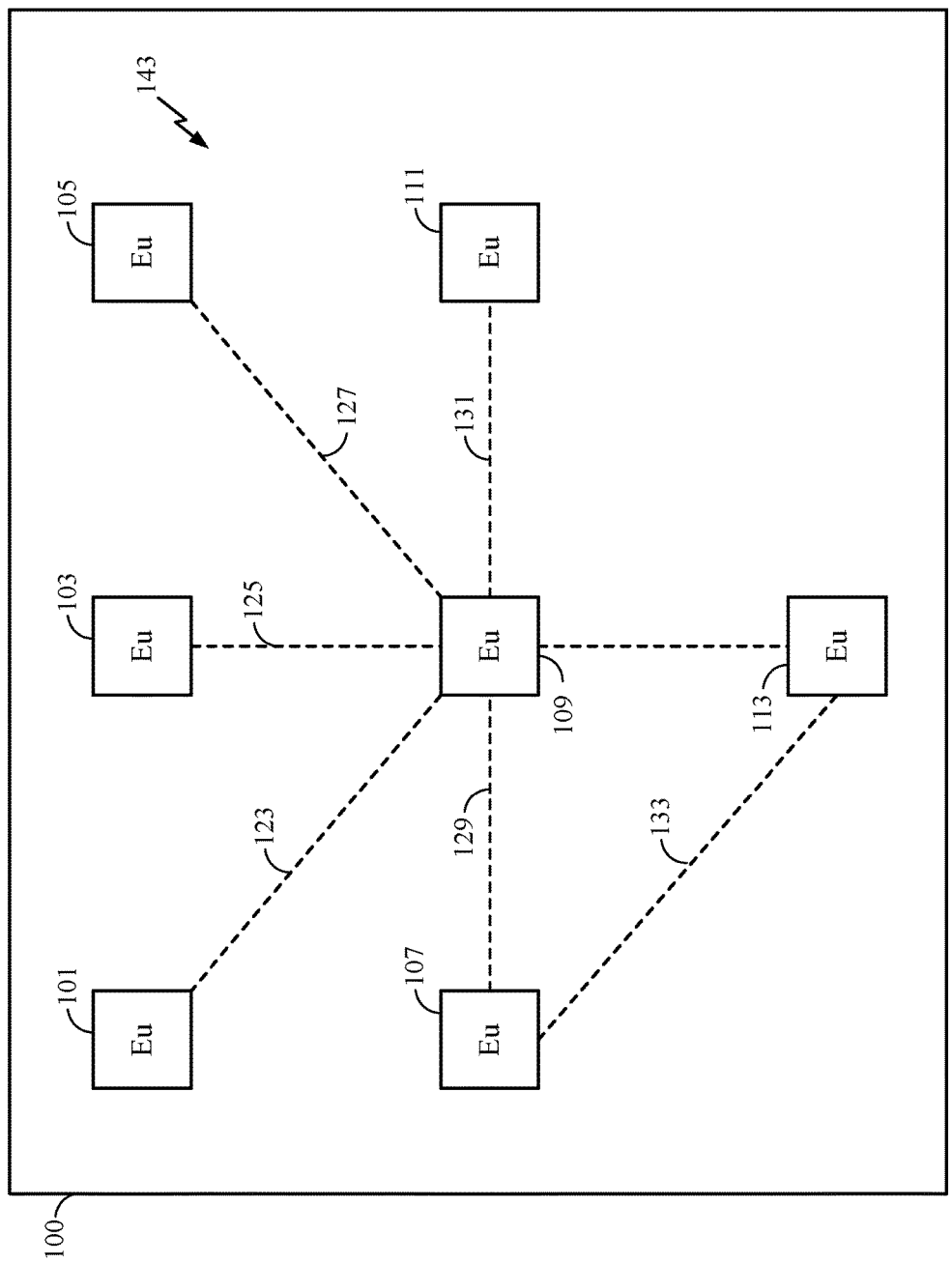
FIG. 1 is an illustration of an exemplary integrated circuit employing a system-on-chip (SoC) interconnection fabric, in accordance with certain aspects of the present disclosure.

FIG. 1 is an illustration of an exemplary integrated circuit 100 employing a SoC interconnection fabric 143, in accordance with certain aspects of the present disclosure. The illustrative fabric 143 includes EUs 101-113 coupled by buses 123-133.

Buses 123-133 transmit and receive data in discrete chunks comprising one or more bits between EUs 101-113. A bus transaction may communicate successive chunks of data in sequence. Each chunk of data in a bus transaction may be referred to as a beat. A beat is the smallest indivisible transmission of data across a bus. Each beat may transfer one or more bits of information, depending on the bus configuration.

In some aspects, EUs may be coupled together by separate buses or shared buses.

Figure 2:
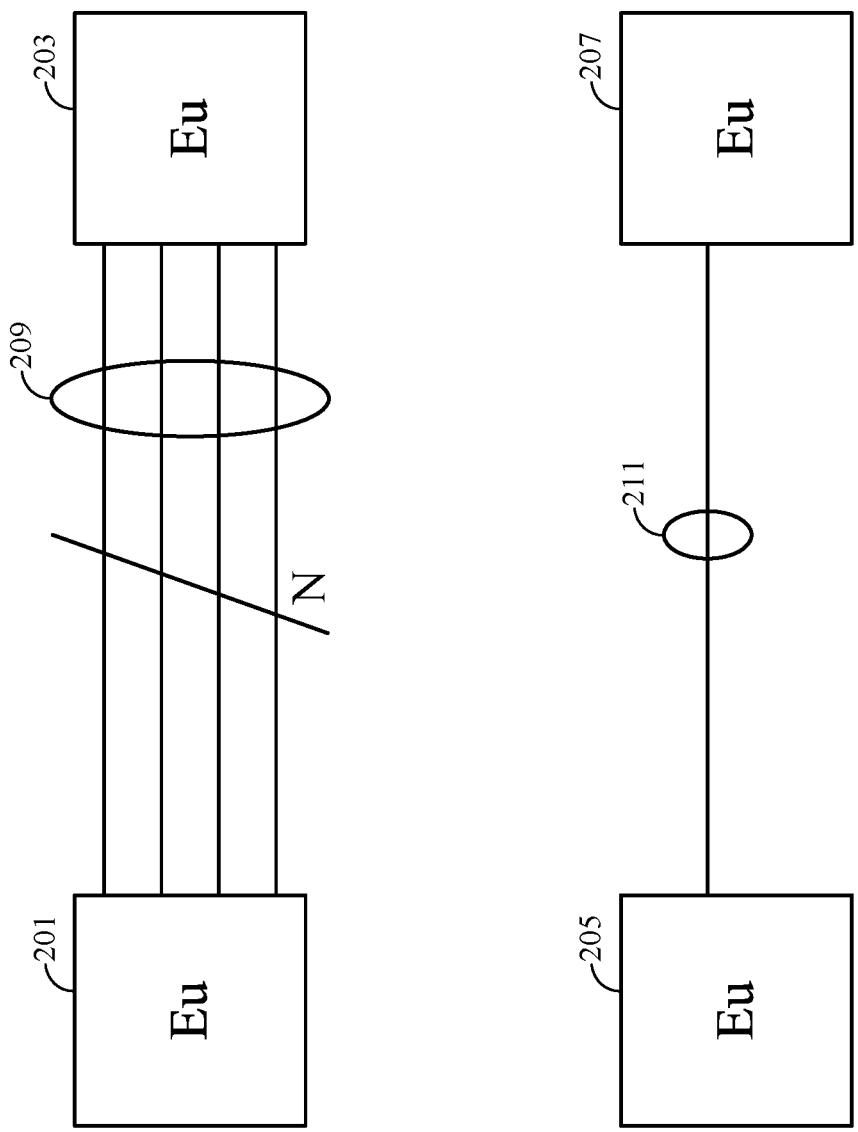
FIG. 2 is an illustration of serial and parallel bus configurations, in accordance with certain aspects of the present disclosure.

FIG. 2 is an illustration of serial and parallel bus configurations, in accordance with certain aspects of the present disclosure. For example, bus 209 illustrates a parallel bus configuration between EUs 201 and 203. Bus 209 as shown includes N conductors. In some aspects, each conductor can communicate one bit per beat. Accordingly, the N conductors between EUs 201 and 203 can communicate N bits per beat (e.g., an N bit word). In some aspects, though not shown, the bus 209 may include additional conductors between EUs 201 and 203 to communicate other information (e.g., control information, metadata, etc.).

Bus 211 illustrates a serial configuration between EUs 205 and 207. Bus 211 as shown includes a single conductor. Accordingly, the conductor between EUs 205 and 207 can communicate one bit per beat. Data transmitted across such serial buses commonly comprises a plurality of beats where bits are transmitted serially. In some aspects, though not shown, the bus 211 may include additional conductors between EUs 205 and 207 to communicate other information (e.g., control information, metadata, etc.).

The teachings herein may apply to both parallel and serial bus configurations, as well as variations thereof. For the sake of clarity, and to avoid unnecessary obfuscations of the teachings herein, common structures have been omitted. Throughout this disclosure common and well known structures not necessary for the understanding of the teachings herein are also omitted so that the inventive teachings herein are not obscured.

Figure 3:
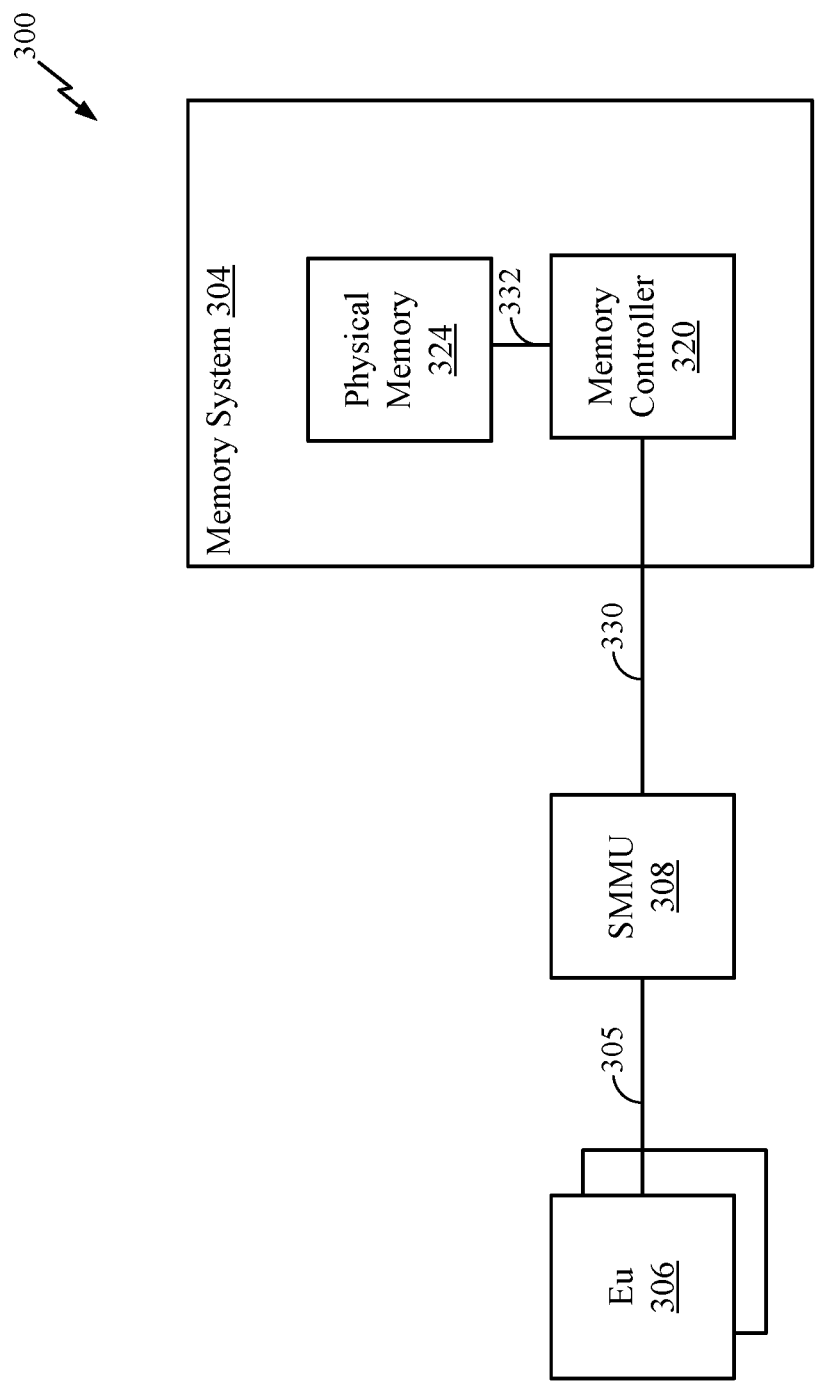
FIG. 3 illustrates a system including a memory system for communicating data between an electronic unit (EU) (e.g., of a system-on-chip (SoC)) and a physical memory, in accordance with certain aspects of the present disclosure.

FIG. 3 illustrates a system 300 including a memory system 304 (e.g., dynamic random access memory (DRAM) system, such as a double data rate (DDR) DRAM system), in accordance with certain aspects of the present disclosure. The system 300 may be implemented in any computing device, including a personal computer, a workstation, a server, a portable computing device (PCD), such as a cellular telephone, a portable digital assistant (PDA), a portable game console, a palmtop computer, or a tablet computer. One or more components of the system 300 may be implemented on an integrated circuit (e.g., SoC).

As shown, the system 300 comprises various on-chip components, including one or more EUs 306 that may access (e.g., read/write) memory resources of the memory system 304. The EUs 306, as discussed, may comprise one or more processing units (e.g., central processing unit (CPU), graphics processing unit (GPU), digital signal processor (DSP), display processor, etc.), a video encoder, an intellectual property (IP) core, or other clients requesting read/write access to the memory system 304. The EUs 306 may be coupled to each other via one or more buses. Further, one or more of the EUs 306 are coupled to a system memory management unit (SMMU) 308 via a bus 305. For example, one or more EUs 306 may share a bus 305 to communicate with the SMMU 308, or some EUs 306 may be coupled via separate buses to the SMMU 308. Further, in some aspects, one or more EUs 306 may share the bus 305 to communicate with each other.

The SMMU 308 is coupled to memory controller 320 (e.g., DRAM controller, DDR controller, etc.). The SMMU 308 may be coupled to the memory controller 320 by the bus 330, which may be different than or the same as bus 305. The memory controller 320 may further be coupled to the physical memory 324 (e.g., DRAM, DDR RAM, etc.). The memory controller 320 may be coupled to the physical memory 324 by the bus 332, which may be different than or the same as bus 305 or bus 330.

EUs 306 may access the physical memory 324 via the SMMU 308 and the memory controller 320. For example, the SMMU 308 may provide a virtual memory to the EU 308 that allows the EU 308 to access a contiguous virtual memory address space for each process (e.g., software program, function, etc.) running on the EU 308 instead of directly accessing a physical memory address space, which may be fragmented or disjointed. For example, an EU 306 may generate a read/write command and send the command as a bus transaction to the SMMU 308 on the bus 305.

The SMMU 308 may translate the virtual memory address (VA) identified in the bus transaction received from the EU 306 and translate the VA to a physical memory address (PA) of the physical memory 324. The SMMU 308 may send a modified bus transaction corresponding to the bus transaction from the EU 306 to the memory controller 320 on the bus 330. The modified bus transaction may include the PA of the physical memory 324 instead of the VA of the original bus transaction from the EU 306. The memory controller 320 may handle the physical signaling and communication with the physical memory 324 to read/write data according to the modified bus transaction. For example, the memory controller 320 may contain the logic needed to read and write to the physical memory 324 and refresh the physical memory 324. The memory controller 320 may communicate with the physical memory 324 on the bus 332 to read/write data according to the bus transaction received from the SMMU 308.

The physical memory 324 may further send data (e.g., based on a read command) to the memory controller 320, which may send data to the SMMU 308, which may further send data to the EU 306.

Figure 3A:
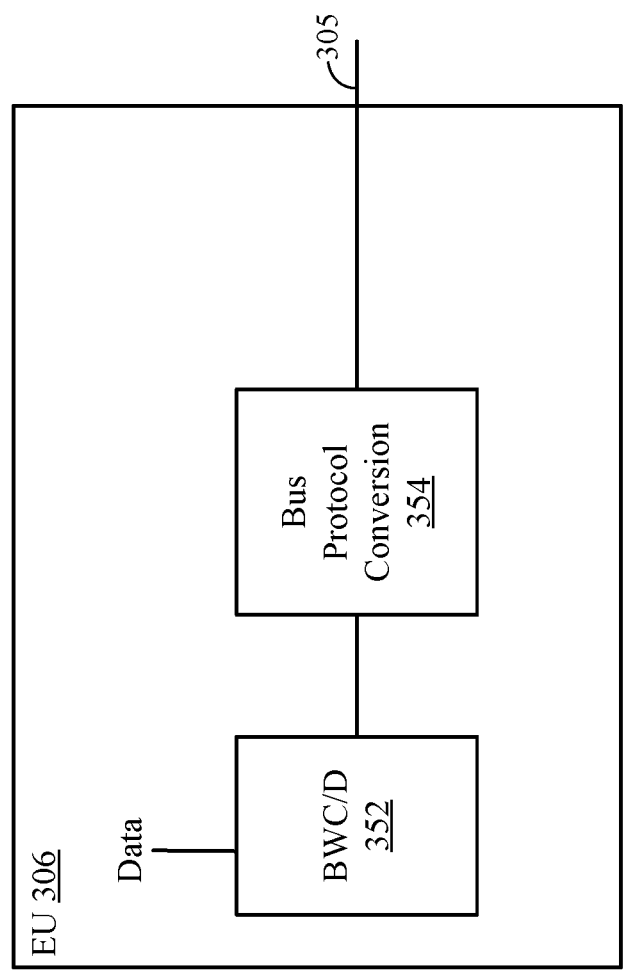
FIG. 3A illustrates a block diagram of an example of an EU of FIG. 3, in accordance with certain aspects of the present disclosure.

FIG. 3A illustrates a block diagram of an example of an EU 306 (e.g., GPU), in accordance with certain aspects of the present disclosure. The EU 306 may be configured to utilize bandwidth compression/decompression (BWC/D) to reduce the bandwidth needed to transmit data on the buses between components of the system 300. For example, the EU 306, as shown, includes a BWC/D component 352 configured to apply bandwidth compression to data (e.g., image data) to reduce the bandwidth (e.g., size) of the data. The BWC/D component 352 may further be configured to decompress compressed data. The BWC/D component 352 may be implemented in hardware or software of the EU 306. Further, though the BWC/D component 352 is shown as a single element, in some aspects, the BWC/D component 352 may comprise separate components for compression and decompression (e.g., a bandwidth compression (BWC) component and a bandwidth decompression (BWD) component, respectively). Further, in some aspects, an EU 306 may include only one of the BWC and BWD components. By reducing the size of the data communicated over the buses and stored in memory, the power consumption of the system 300 may be reduced. For example, the bus power and memory power required to perform data writes may be reduced as fewer bits are transferred on the bus and written to the memory. Further, since the data stored in the memory is compressed, the number of bits read from the memory may also be reduced, therefore reducing the power required for a data read.

For example, the EU 306 may have data to write to the physical memory 324. The BWC/D component 352 may apply a compression technique (e.g., tile based compression scheme for image data divided into tiles) to the data to write to the physical memory 324. The BWC/D component 352 may pass the compressed data to a bus protocol conversion component 354. The bus protocol conversion component 354 may be implemented in hardware or software of the EU 306. The bus protocol conversion component 354 is configured to convert the compressed data to a bus transaction and send the data as a bus transaction to the SMMU 308 for further communication to the physical memory 324 as described herein. In some aspects, where the data comprises a tile of image data, the writing of the compressed tile may correspond to a single bus transaction to the SMMU 308.

In addition to transmitting the actual compressed data to the SMMU 308, the bus protocol conversion component 354 may communicate the address information (e.g., VA) of where to write the compressed data to the SMMU 308 over the bus 305. Further, the bus protocol conversion component 354 may send metadata about the compressed data to the SMMU 308 along with address information (e.g., VA) of where to write the metadata to the SMMU 308 over the bus 305. In some aspects, the bus protocol conversion component 354 may send the metadata to the SMMU 308 in a different bus transaction than the compressed data. The metadata my include information used for decompressing the compressed data. For example, the metadata may include an indication of the type of compression applied, a size of the data before compression, a size of the compressed data, header information, etc.

In some aspects, the same or another EU 306 may read the compressed data from the physical memory 324. In particular, as discussed, the bus protocol conversion component 354 may generate a bus transaction corresponding to a read command of compressed data (e.g., a single bus transaction to read a single compressed tile from the physical memory 324). The bus transaction may further indicate a VA of the compressed tile. The bus protocol conversion component 354 may send the bus transaction to the SMMU 308 over the bus 305. The bus protocol conversion component 354 may further generate a separate bus transaction corresponding to a read command of the metadata associated with the compressed data. The bus transaction may further indicate a VA of the metadata. The bus protocol conversion component 354 may send the bus transaction to the SMMU 308 over the bus 305

The SMMU 308 may further communicate over the bus 330 with the memory controller 320, which may communicate over the bus 332 with the physical memory 324. The memory controller 320 may receive the compressed data and corresponding metadata from the physical memory 324 over bus 332 (e.g., as separate bus transactions). The memory controller 320 may send the compressed data and corresponding metadata to the SMMU 308 over bus 330 (e.g., as separate bus transactions). The SMMU 308 may send the compressed data and corresponding metadata to the EU 306 over bus 305 (e.g., as separate bus transactions). The bus protocol conversion component 354 may convert the bus transaction(s) to the compressed data and metadata and pass the compressed data and metadata to the BWC/D component 352. The BWC/D component 352 may decompress the compressed data based on the corresponding metadata to retrieve the original data (e.g., tile data).

In certain aspects, as discussed, each time the EU 306 performs a transaction request (read or write) with respect to the physical memory 324, multiple bus transactions (e.g., over buses 332, 330, and 305) are performed to read or write the data at the physical memory 324 and communicate the data between the EU 306 and the physical memory 324. For example, to perform a write transaction request, the EU 306 writes the data to physical memory 324 as one bus transaction and writes the associated metadata to the physical memory 324 as a separate bus transaction. To perform a read transaction request, the EU 306 reads the metadata from physical memory 324 as one bus transaction, and then reads the associated metadata from the physical memory 324 as a separate bus transaction.

Further, in certain aspects, even if bandwidth compression is not utilized, each time the EU 306 performs a transaction request (read or write), the EU 306 performs a bus transaction (e.g., over buses 332, 330, and 305) to read or write the data at the physical memory 324 and communicate the data between the EU 306 and the physical memory 324. The data passed over the bus may be large and utilize significant bandwidth on the bus, and therefore utilize power of the SoC to communicate the data over the bus.

Accordingly, certain aspects of the present disclosure are directed to systems and methods for implementing transaction elimination using metadata. In particular, certain aspects provide techniques for eliminating certain bus transactions for reading/writing data at physical memory 324 related to performing a transaction request. For example, in certain aspects, for performing a transaction request (e.g., read/write), the EU 306 may perform two bus transactions for each read or write, one for the data and one for the metadata. Certain aspects herein relate to elimination of the bus transaction corresponding to the read or write of the data based on the metadata bus transaction for the read or write. Advantageously, such aspects may lead to reduced bandwidth usage of the bus and reduced power consumption to communicate data over the bus.

In particular, in certain aspects, for data to be initially written to the physical memory 324, the EU 306 generates a signature that corresponds to the content of the data. The unique signature may be generated as a function of the content of the data. The unique signature may be used as the metadata for the data or as part of the metadata (e.g., if BWC is used, the metadata may also include information regarding BWC). The metadata including the unique signature and the data itself are then stored in the physical memory 324.

Further, in some aspects, at the EU 306 or somewhere on the system 300, a local buffer (e.g., system cache, on-chip memory, etc.) may be maintained for recent read or write transaction requests. In particular, the local buffer may be configured to store the data and corresponding unique signature of the latest N (where N is an integer) read/write transaction requests. In some aspects, each EU 306 has its own local buffer. In some aspects, the local buffer is shared between multiple EUs 306.

Accordingly, in certain aspects, when the EU 306 has a read transaction request to perform, the EU 306 first reads the metadata for the transaction request from the physical memory 324. The EU 306 then checks if the unique signature in the metadata read from physical memory 324 corresponds to a unique signature stored at the local buffer. If so, the EU 306 reads the data associated with the unique signature stored in the local buffer instead of having to read the data from physical memory 324. Accordingly, if the data is available in the local buffer, the EU 306 can eliminate a read bus transaction to physical memory 324. If the unique signature is not stored at the local buffer, the EU 306 reads the data from the physical memory 324, and stores the unique signature and data in the local buffer.

Similarly, in certain aspects, when the EU 306 has a write transaction request to perform, the EU 306 first generates a unique signature for the data. The EU 306 then determines if the unique signature is stored in the local buffer. If so, the EU 306 does not need to store the data in the physical memory 324 again, and instead may only write the metadata to physical memory 324. Accordingly, the EU 306 can eliminate a write bus transaction to physical memory 324. Otherwise, the EU 306 may write both the unique signature and the data to the physical memory 324 and the local buffer.

Though reading/writing the unique signature as metadata at the physical memory 324 for each transaction request utilizes additional bandwidth and power for transferring the metadata over the bus between EU 306 and physical memory 324, the elimination of transferring some of the corresponding data over the bus between EU 306 and physical memory 324 may reduce overall bandwidth and power used for transfers over the bus by the system 300. In particular, the size of the unique signature may be significantly smaller than the corresponding data, so the additional overhead of the bus transactions for the unique signature may be outweighed by the elimination of at least some bus transactions for the corresponding data.

Figure 3B:
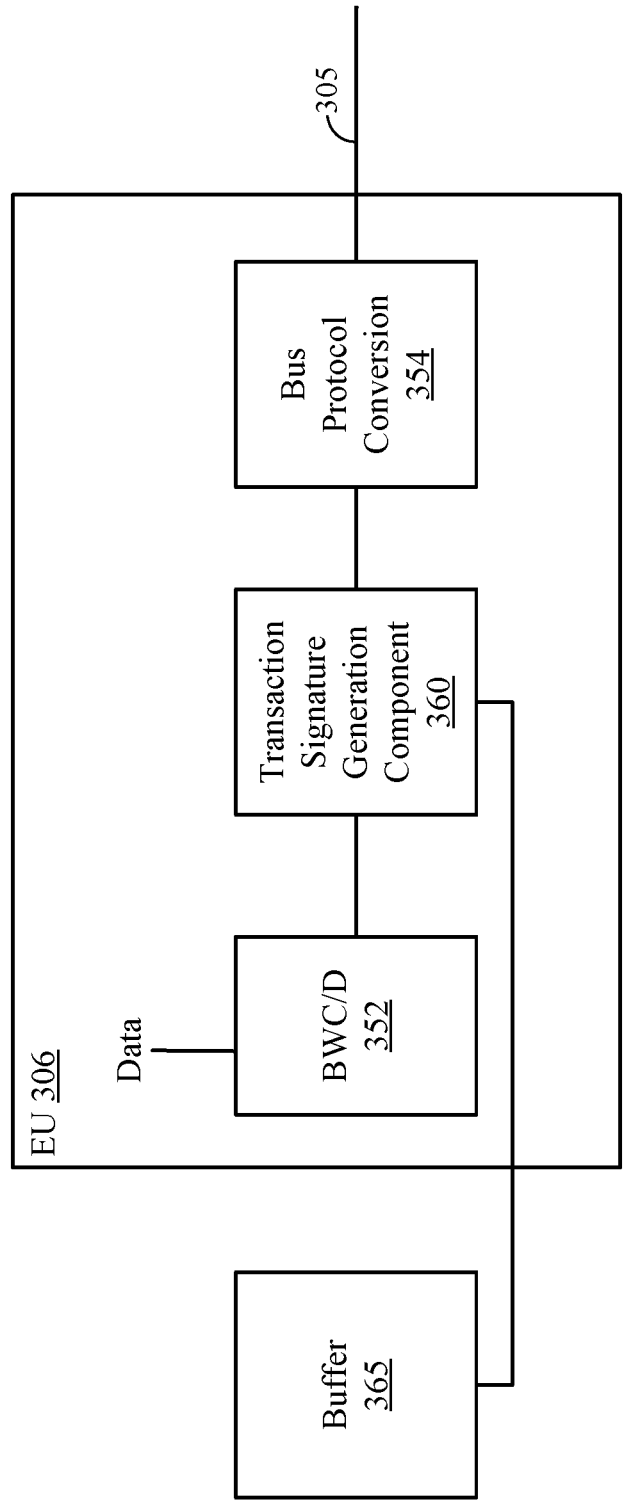
FIG. 3B illustrates a block diagram of an example of an EU of FIG. 3 configured to implement transaction elimination using metadata, in accordance with certain aspects of the present disclosure.

FIG. 3B illustrates a block diagram of an example of an EU 306, in accordance with certain aspects of the present disclosure. In particular, EU 306 is configured to implement transaction elimination using metadata. As shown, the EU 306 of FIG. 3B is similar to the EU 306 of FIG. 3A. However, the EU 306, in addition to the optional BWC/D component 352 and the bus protocol conversion component 354, further includes a transaction signature generation component (TSGC) 360. TSGC 360 is further coupled to a buffer 365 (e.g., a local buffer, system cache, on-chip memory, etc.). In particular, in certain aspects, the buffer 365 is on the same chip as the EU 306 (e.g., unlike physical memory 324, which may be off-chip from the EU 306). The buffer 365 may be in the EU 306, in another EU, somewhere else on the chip, etc. Accessing an on-chip memory, such as buffer 365, as compared to off-chip memory, such as physical memory 324, requires less bandwidth on the bus to physical memory 324, and therefore is more power efficient.

TSGC 360 is configured to receive transaction requests for the EU 306 to physical memory 324 and perform transaction elimination as discussed further herein. For example, the EU 306 may have data to write to the physical memory 324. The optional BWC/D component 352 may optionally apply a compression technique (e.g., tile based compression scheme for image data divided into tiles) to the data to write to the physical memory 324. The BWC/D component 352 may pass the compressed data to the TSGC 360. Alternatively, if the EU 306 does not include the BWC/D component 352, the TSGC 360 directly receives the uncompressed data.

The TSGC 360 then computes a unique signature based on the data (e.g., compressed data or uncompressed data). For example, the TSGC 360 may apply a function (e.g., cyclic redundancy check (CRC), polynomial, message authentication code, etc.) to the data that generates the unique signature. In certain aspects, the function is configured such that for different data as input, different unique signatures are generated. Accordingly, in certain aspects, the unique signature is unique to the data and uniquely identifies the data. The TSGC 360 component may then determine whether the same unique signature as generated for the data is stored in the buffer 365. If the unique signature is not stored in the buffer 365 (e.g., this is the first time this data is being written to physical memory 324), the TSGC 360 passes the unique signature and data to the bus protocol conversion component 354. Further, the TSGC 360 may store the unique signature and data in the buffer 365.

The bus protocol conversion component 354 is configured to convert the data to a bus transaction and send the data as a bus transaction to the SMMU 308 for further communication to the physical memory 324 as described herein. In addition to transmitting the actual data to the SMMU 308, the bus protocol conversion component 354 may communicate the address information (e.g., VA) of where to write the data to the SMMU 308 over the bus 305.

Further, the bus protocol conversion component 354 may generate and send metadata about the data to the SMMU 308 along with address information (e.g., VA) of where to write the metadata to the SMMU 308 over the bus 305. The bus protocol conversion component 354 includes the unique signature (and optionally BWC information), corresponding to the data, received from the TSGC 360 in the metadata generated and sent to the SMMU 308. In certain aspects, by including both the BWC information and the unique signature in a single metadata and transferring that metadata as a single bus transaction, additional power savings are achieved by using a single bus transaction to store BWC and signature data. In some aspects, the bus protocol conversion component 354 may send the metadata to the SMMU 308 in a different bus transaction than the data over the bus 305.

In some aspects, the SMMU 308 may translate the VA for storing the data and the VA for storing the metadata to corresponding PAs in the physical memory 324. The SMMU 308 may further communicate the data and the metadata to the memory controller 320 over the bus 330. The memory controller 320 may communicate the data and metadata to the physical memory 324 and direct storage of the data and metadata in the physical memory 324.

In some aspects, the same or another EU 306 may perform a read transaction request of data stored in the physical memory 324. In particular, the TSGC 360 may receive a read transaction request. The read transaction may indicate address information (e.g., VA) of where the data is stored, and address information (e.g., VA) of where the corresponding metadata is stored. The TSGC 360 may instruct the bus protocol conversion component 354 to read the metadata, but not the data, from the physical memory 324.

In particular, as discussed, the bus protocol conversion component 354 may generate a bus transaction corresponding to a read command of the metadata from the physical memory 324. The bus transaction may further indicate a VA of the metadata. The bus protocol conversion component 354 may send the bus transaction to the SMMU 308 over the bus 305.

The SMMU 308 may further communicate over the bus 330 with the memory controller 320, which may communicate over the bus 332 with the physical memory 324. The memory controller 320 may receive the metadata from the physical memory 324 over bus 332. The memory controller 320 may send the metadata to the SMMU 308 over bus 330. The SMMU 308 may send the metadata to the EU 306 over bus 305. The bus protocol conversion component 354 may convert the bus transaction to the metadata and pass metadata to the TSGC 360.

As discussed, the metadata includes a unique signature corresponding to the data associated with the metadata. The TSGC 360 may then determine whether the unique signature is stored in the buffer 360 (e.g., perform a lookup of the buffer 360). If the unique signature is stored in the buffer 360, the TSGC 360 retrieves the corresponding data stored with the unique signature from the buffer 360. The retrieved data corresponds to the data requested for the read transaction request. Accordingly, the EU 306 can retrieve the data from the buffer 360 and eliminate the bus transaction to the physical memory 324 to read the data. In some aspects, the data is compressed and passed to the BWC/D component 352 for decompression.

If the unique signature is not stored in the buffer 360, the TSGC 360 may instruct the bus protocol conversion component 354 to read the data from the physical memory 324.

In particular, as discussed, the bus protocol conversion component 354 may generate a bus transaction corresponding to a read command of the data from the physical memory 324. The bus transaction may further indicate a VA of the data. The bus protocol conversion component 354 may send the bus transaction to the SMMU 308 over the bus 305.

The SMMU 308 may further communicate over the bus 330 with the memory controller 320, which may communicate over the bus 332 with the physical memory 324. The memory controller 320 may receive the data from the physical memory 324 over bus 332. The memory controller 320 may send the data to the SMMU 308 over bus 330. The SMMU 308 may send the data to the EU 306 over bus 305. The bus protocol conversion component 354 may convert the bus transaction to the data and pass metadata to the TSGC 360. The TSGC 360 may store the retrieved data and the corresponding unique signature in the buffer 365. In some aspects, the data is compressed and passed to the BWC/D component 352 for decompression.

In certain aspects, the same or another EU 306 may perform a write transaction request of data already stored in the physical memory 324. The optional BWC/D component 352 may optionally apply a compression technique (e.g., tile based compression scheme for image data divided into tiles) to the data. The BWC/D component 352 may pass the compressed data to the TSGC 360. Alternatively, if the EU 306 does not include the BWC/D component 352, the TSGC 360 directly receives the uncompressed data.

The TSGC 360 then computes a unique signature based on the data (e.g., compressed data or uncompressed data). The TSGC 360 component may then determine whether the same unique signature as generated for the data is stored in the buffer 365. If the unique signature is stored in the buffer 365, the TSGC 360 may not store the data in the physical memory 324, but instead may only store the metadata in the physical memory 324 as described. In certain aspects, the TSGC 360 does not store the data to physical memory 324 only when the data stored to physical memory 324 is to be read in the same order as it is written to physical memory 324. Accordingly, as the data is read, the data not stored in physical memory 324 is available in the local buffer 365.

Otherwise, in certain aspects, the TSGC 360 may store the data in the physical memory 324 as well. According to the described aspects, a read/write bus transaction may be eliminated.

Figure 4:
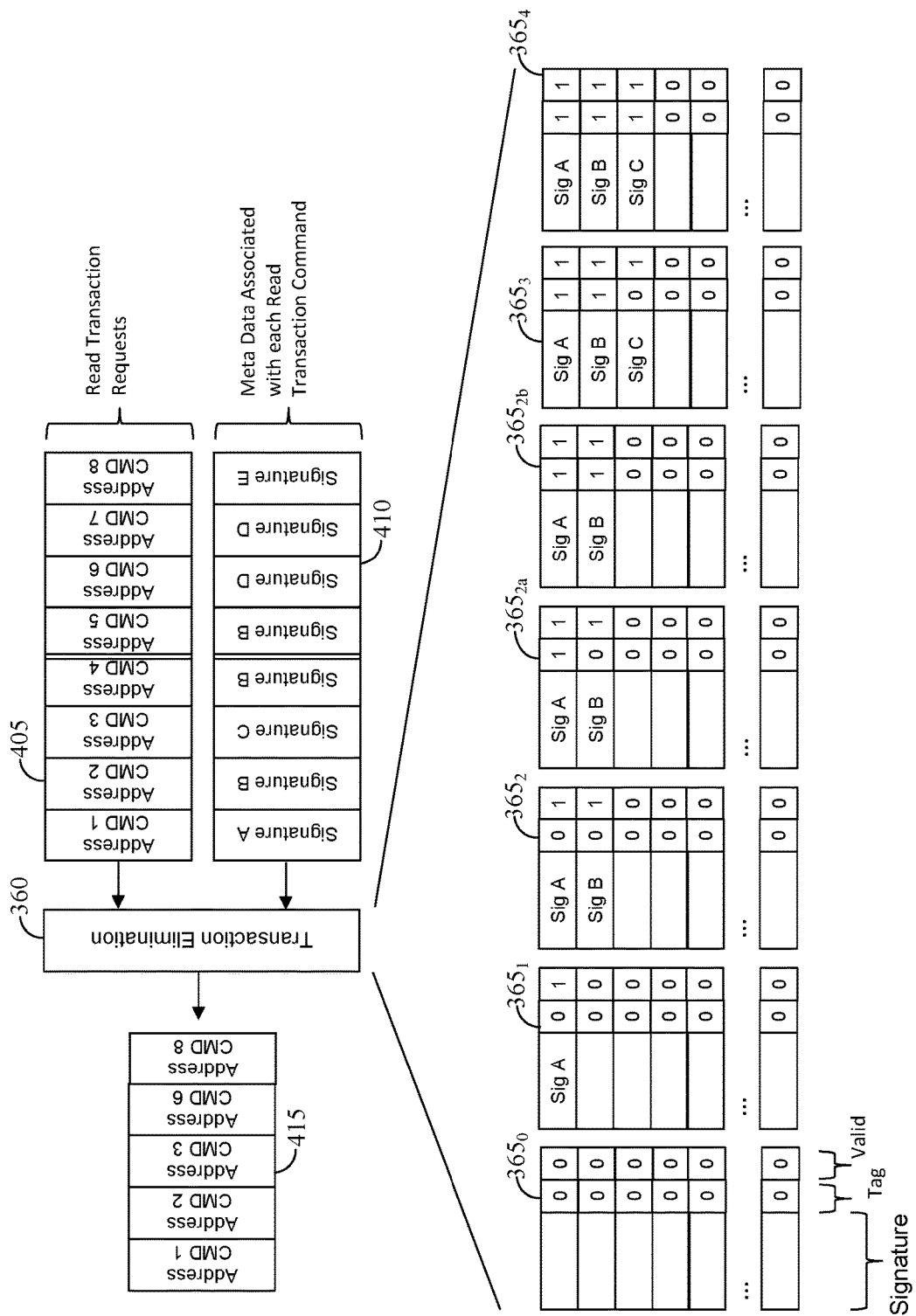
FIG. 4 illustrates an example of transaction elimination.

FIG. 4 illustrates an example of transaction elimination as discussed with respect to FIG. 3B. FIG. 4 illustrates a plurality of transaction requests 405 and corresponding unique signatures 410 for each of the transaction requests 405. As shown, the plurality of transaction requests 405 include eight separate transaction requests (Address CMD 1-8) corresponding to read requests at different addresses of physical memory 324. The transaction requests 405 are processed by TSGC 360 as shown. Further, the state of buffer 365 after each transaction request X is shown as buffer $365_X$. Initially, the state of buffer 365 is empty, shown as buffer $365_0$. The state of buffer $365_X$ as shown includes a column identifying unique signatures stored in the buffer 365.

In addition, the state of buffer $365_X$ includes two additional (optional) columns. One column is shown as a "valid" column. In particular, in certain aspects, the buffer 365 is configured to store a validity identifier (e.g., one bit) associated (e.g., in the "valid" column) with the unique signature that indicates whether the associated unique signature stored in the buffer 365 is valid. In certain aspects, the TSGC 360 may set the validity identifier to indicate that data (e.g., a signature) stored in the buffer 365 is a valid signature, and not just junk data in the buffer 365. In particular, the TSGC 360 may set the validity identifier corresponding to a new signature to true when storing the new signature in the buffer 365, and may set the validity identifier for one or more signatures to false when removing a signature or initializing the buffer 365 to remove all signatures. Accordingly, the TSGC 360 may only search for matching signatures in portions of the buffer 365 indicated as storing valid signatures. As shown, buffer $365_0$ is initialized to indicate that none of the signature rows in buffer 365 includes a valid signature (e.g., valid column set to 0).

The second column is shown as a "tag" column. In particular, in certain aspects, the TSGC 360 may be configured to store the unique signature in buffer 365 before storing the corresponding data in buffer 365. Accordingly, in certain aspects, the buffer 365 may include a presence identifier (e.g., one bit) (e.g., in the "tag" column) associated with the unique signature that indicates whether the data corresponding to the unique signature is stored in the buffer 365. In certain aspects, the TSGC 360 may set the presence identifier to indicate that the data is not stored in the buffer 365 when initially storing the unique signature, later receive and store the corresponding data (as described with respect to FIG. 5), and then update the presence identifier to indicate that the data is stored in the buffer 365. Accordingly, if the TSGC 360, for a read transaction request, finds a matching unique signature in buffer 365, but the presence identifier indicates the data is not stored in the buffer 365, the TSGC 360 may wait (e.g., one or more cycles) and then access the buffer 365 again later to read the data from the buffer 365. As shown, buffer $365_0$ is initialized to indicate that none of the signature rows in buffer 365 has corresponding data stored in buffer 365 (e.g., tag column set to 0).

When the first transaction request for Address CMD 1 is received, the metadata corresponding to Address CMD 1 is read from physical memory 324, the metadata including unique signature Signature A. The TSGC 360 looking at buffer $365_0$ finds no matching stored Signature A. Accordingly, TSGC 360 stores Signature A in buffer 365 based on the processing of Address CMD 1 and initiates a read of the data associated with Signature A from physical memory 324. Further, the TSGC 360 sets the valid column associated with Signature A to indicate the signature is valid (e.g., value 1 in the valid column), but the tag column to indicate that the data associated with Signature A is not present in the buffer 365 (e.g., value 0 in tag column). Therefore, the state of buffer 365 after Address CMD 1 is shown as buffer $365_1$ which includes Signature A.

When the second transaction request for Address CMD 2 is received, the metadata corresponding to Address CMD 2 is read from physical memory 324, the metadata including unique signature Signature B. The TSGC 360 looking at buffer $365_1$ finds no matching stored Signature B. Accordingly, TSGC 360 stores Signature B in buffer 365 based on the processing of Address CMD 2 and initiates a read of the data associated with Signature B from physical memory 324. Further, the TSGC 360 sets the valid column associated with Signature B to indicate the signature is valid (e.g., value 1 in the valid column), but the tag column to indicate that the data associated with Signature B is not present in the buffer 365 (e.g., value 0 in tag column). Therefore, the state of buffer 365 after Address CMD 2 is shown as buffer $365_2$ which includes Signatures A and B.

Before the third transaction request is processed by TSGC 360, the data associated with Signature A arrives from physical memory 324 and is stored in buffer 365. Accordingly, the TSGC 360 sets the tag column associated with Signature A to indicate that the data associated with Signature A is present in the buffer 365 (e.g., value now becomes 1 in tag column), as shown as buffer $365_{2a}$.

Further, before the third transaction request is processed by TSGC 360, the data associated with Signature B arrives from physical memory 324 and is stored in buffer 365. Accordingly, the TSGC 360 sets the tag column associated with Signature B to indicate that the data associated with Signature B is present in the buffer 365 (e.g., value now becomes 1 in tag column), as shown as buffer $365_{2b}$.

When the third transaction request for Address CMD 3 is received, the metadata corresponding to Address CMD 3 is read from physical memory 324, the metadata including unique signature Signature C. The TSGC 360 looking at buffer $365_{2b}$ finds no matching stored Signature C. Accordingly, TSGC 360 stores Signature C in buffer 365 based on the processing of Address CMD 3 and initiates a read of the data associated with Signature C from physical memory 324. Further, the TSGC 360 sets the valid column associated with Signature C to indicate the signature is valid (e.g., value 1 in the valid column), but the tag column to indicate that the data associated with Signature C is not present in the buffer 365 (e.g., value 0 in tag column). Therefore, the state of buffer 365 after Address CMD 3 is shown as buffer $365_3$ which includes Signatures A, B, and C.

When the fourth transaction request for Address CMD 4 is received, the metadata corresponding to Address CMD 4 is read from physical memory 324, the metadata including unique signature Signature B. The TSGC 360 looking at buffer $365_3$ finds matching Signature B stored. Accordingly, TSGC 360 eliminates the transaction to physical memory 324 with respect to Address CMD 4 and instead uses the data retrieved from physical memory 324 based on Address CMD 2 stored in buffer 365. Further, the data associated with Signature C arrives from physical memory 324 and is stored in buffer 365. Accordingly, the TSGC 360 sets the tag column associated with Signature C to indicate that the data associated with Signature C is present in the buffer 365 (e.g., value now becomes 1 in tag column), as shown as buffer $365_4$.

Similarly, the fifth transaction request for Address CMD 5 corresponds to Signature B as well and can be eliminated as the data for Signature B was retrieved and stored in buffer 365 based on Address CMD 2. In addition, Address CMD 6, 7, and 8 are similarly processed, with Address CMD 7 being eliminated as the data for Signature D was retrieved and stored in buffer 365 based on Address CMD 6.

Figure 5:
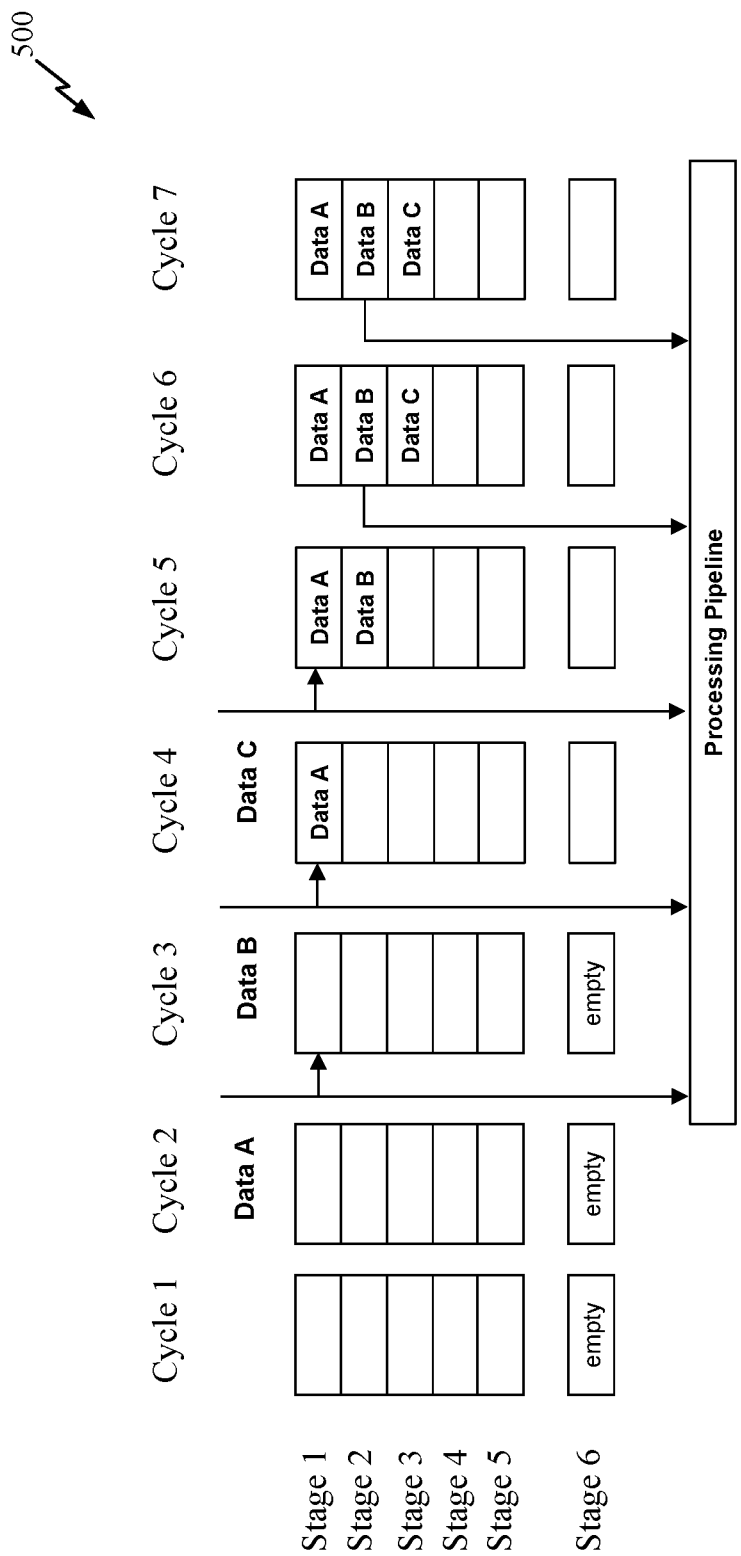
FIG. 5 illustrates an example of a data processing pipeline for an EU of FIG. 3.

In certain aspects, the reading and writing of data to physical memory 324, and processing of the data by the EU 306 may be part of an overall data processing pipeline of the EU 306 or system 300. For example, FIG. 5 illustrates an example of a data processing pipeline 500 for EU 306. As shown, the data processing pipeline 500 is shown as a column of cells corresponding to stages (shown as stages 1-6) of the data processing pipeline 500. In particular, for each command initiated, data is processed stage by stage through the data processing pipeline 500. In particular, data may be processed and moved from stage to stage at each cycle (e.g., clock cycle). Further, as shown in FIG. 5, an example of the contents of the data processing pipeline 500 from one cycle to the next (shown as cycles 1-7) is illustrated. In particular, in one example, a read transaction request of Data A is performed during cycle 2, a read transaction request of Data B is performed during cycle 3, and a read transaction request of Data C is performed at cycle 4. As shown in FIG. 5, the data requested with respect to a read transaction request is not available for two cycles. In particular, Data A is not available until cycle 4, Data B is not available until cycle 5, and Data C is not available until cycle 6. The delay may be caused by processing and transaction delays for retrieving the data from physical memory 324. Accordingly, as illustrated by this example, there may be a delay between when a data read transaction request is performed, and the data is available to the EU 306 (e.g., the TSGC 360 for storage in the buffer 365). Therefore, even though data may be on its way to the buffer 365 due to a previous read transaction request, it may not be available in the buffer 365 for a subsequent read transaction request for the same data (e.g., data with the same content).

In certain aspects, when the EU 306 reads metadata from physical memory 324 it reads multiple metadatas (e.g., a contiguous block of metadata corresponding to a plurality of read transaction requests in order) from physical memory 324 instead of just a single metadata for a single transaction request. The EU 306 may store the multiple metadata information and utilize the unique signatures in the multiple metadata to potentially eliminate multiple data bus transaction based on a single metadata bus transaction.

In certain aspects, the size of the metadata including the unique signature is less than the size of the actual corresponding data stored in physical memory 324 to reduce the bandwidth for performing transaction requests as discussed herein. However, as discussed, the unique signature may still need to be unique to particular data (e.g., content of the data). Therefore, there may be a limit to the size (e.g., how small) of the unique signature. Further, in certain aspects, the process for the TSGC 360 determining whether there is a match in the buffer 365 for a unique signature should have a low latency, to prevent excess power consumption for performing the search and for preventing latency in processing of data at the EU 306.

Accordingly, in some aspects, instead of generating a single unique signature corresponding to data stored/to be stored in the physical memory 324, the TSGC 360 is configured to generate a plurality (e.g., 2 or more) signatures for the data. The discussed metadata may accordingly include the plurality of signatures. Each of these plurality of signatures may be used for a different one of a plurality of stages (e.g., 2 stages) used to match generated/retrieved signatures to stored signatures as further discussed herein.

For example, in certain aspects, the TSGC 360 generates a unique signature as discussed, and further generates at least one non-unique signature corresponding to the data. In certain aspects, a non-unique signature is generated using a simpler generation technique (e.g., using a shorter polynomial than a polynomial used to generate a unique signature) with respect to data. In certain aspects, the non-unique signature is generated by using only a fraction of the data to generate the corresponding non-unique signature instead of using all of the data (e.g., such as for a unique signature). Unlike a unique signature, a non-unique signature may not be unique to the data used to create the non-unique signature and may not uniquely identify the data. For example, different data may, when used with the simpler generation technique, generate the same non-unique signature. However, not all data generates the same non-unique signature. The non-unique signature may be computationally less complex to generate and therefore may be generated more quickly than a unique signature. Further, in certain aspect, the non-unique signature may be shorter than the unique signature. Accordingly, matching a generated non-unique signature to stored non-unique signatures may take less computational complexity and therefore less time than matching unique signatures.

Therefore, in certain aspects described herein where TSGC 360 generates a unique signature and determines whether a matching unique signature is stored (e.g., in buffer 365 and/or physical memory 324) the TSGC 360 instead generates multiple signatures and performs multiple matching stages as discussed further herein. Further, in certain aspects, where TSGC 360 reads metadata from physical memory 324, the metadata includes multiple signatures and the TSGC performs multiple matching stages as further discussed herein. For example, the TSGC 360 may receive data corresponding to a transaction request (e.g., a read request or a write request) and generate/retrieve a unique signature and at least one non-unique signature for the data. In certain aspects, the unique signature and the at least one non-unique signature are generated/retrieved in parallel. The TSGC 360 then determines whether the same non-unique signature corresponding to the data is also stored (e.g., in buffer 365 and/or physical memory 324). If the non-unique signature is not stored, the TSGC 360 determines there is no matching stored data corresponding to the data of the transaction request. However, if the non-unique signature is stored, the TSGC 360 determines there may be matching stored data corresponding to the data of the transaction request. The TSGC 360 may perform additional non-unique signature matching stages. If after the non-unique signature matching stage it is determined that there may be matching stored data corresponding to the data of the transaction request, the TSGC 360 may determine whether the same unique signature corresponding to the data is also stored (e.g., in buffer 365 and/or physical memory 324). In certain aspects, instead of TSGC 360 trying to match the unique signature of the data to all stored unique signatures, the TSGC 360 may only attempt to match the unique signature to stored data that had a matching non-unique signature. In particular, for there to be a match between the unique signatures, the non-unique signatures would also have to match. Accordingly, the number of unique signature matches that have to be performed may be reduced leading to greater processing and time savings than the processing and time needed to generate the non-unique signatures and perform the matching of the non-unique signatures.

In some aspects, the matching of non-unique and/or unique signatures may be performed utilizing techniques that increase the speed of determining whether the signatures match. For example, in certain aspects, signatures may be stored in hardware using content addressable memory (CAM) or similar hardware that provides a hardware mechanism for quickly performing matching of signatures. For example, the TSGC 360 or buffer 365 may implement a CAM. In some aspects, the matching of signatures may be done in parts. For example, a signature may be broken into two or more parts, and each part may be individually matched to stored signatures (e.g., in parallel) (e.g., assuming fixed length signatures). For example, the TSGC 360 may be configured to break a signature into two or more parts and match the individual parts to stored signatures. If all parts match for a given stored signature, the TSGC 360 determines there is a match. Otherwise, if any of the parts do not match, the TSGC 360 determines there is no match.

In certain aspects, the transaction elimination techniques described herein may be selectively enabled and disabled (e.g., by the TSGC 360). With transaction elimination techniques disabled, unique and/or non-unique signatures may not be generated for data and stored, and further unique and/or non-unique signatures may not be matched. Instead, data may be stored and retrieved from memory normally. In some aspects, transaction elimination may be selectively enabled or disabled for a data corresponding to a particular frame (e.g., image). For example, one of firmware, software, an application on the system 300, etc. may determine that the data in the frame does not contain a threshold amount of matching data, and therefore transaction elimination may not be useful and disabled. If the data in the frame does contain the threshold amount of matching data, transaction elimination may be enabled. In some aspects, transaction elimination may be selectively enabled or disabled based on other types of data including a threshold amount of matching data or not. By selectively disabling transaction elimination, such as signature matching, latency can be reduced in instances where there is no duplication or replication of data being written/read that would benefit from transaction elimination. Further, by selectively enabling transaction elimination, such as signature matching, bus bandwidth can be reduced in instances where there is duplication or replication of data being written/read that would benefit from transaction elimination.

In certain aspects, transaction elimination may be selectively enabled or disabled based on a latency requirement of performing a transaction request for the data (e.g., a latency requirement of an application, process, etc. using the data). For example, the data has a low latency requirement, transaction elimination may be selectively disabled. If the data does not have a low latency requirement, transaction elimination may be selectively enabled.

In some aspects, transaction elimination may be selectively enabled or disabled based on whether historical data (e.g., last N transactions) indicate that it is likely there will be a match for a transaction, to help avoid adding the latency of matching when it is not likely.

In certain aspects, when transaction elimination is enabled, the TSGC 360 only tries to match signatures for data stored with transaction elimination enabled (e.g., data with corresponding metadata including one or more signatures) and does not try matching signatures for data stored with transaction elimination disabled. This may save time and processing by reducing the amount of stored data that is processed for matching.

In certain aspects, the described metadata for data stored (e.g., in buffer 365 and/or physical memory 324) may include a bit that indicates whether transaction elimination is enabled or disabled for the stored data. For example, if the bit indicates that transaction elimination is disabled, the memory system 304 may be configured to automatically also send the corresponding data, without waiting for an explicit request for the corresponding data from the EU 306 that requested the metadata and data. If the bit indicates that transaction elimination is enabled, the memory system 304 may wait for an explicit request as discussed with respect to the transaction elimination techniques described herein. Further, as discussed, the TSGC 360 may only try and match one or more signatures to signatures in metadata with the transaction elimination bit enabled. Accordingly, the TSGC 360 may process the single bit for each stored metadata, but may not need to perform matching for each metadata, thereby reducing latency.

In some aspects, data stored while transaction elimination is enabled is stored in a different portion of memory (e.g., physical memory 324) than data stored while transaction elimination is disabled. For example, data without one or more signatures in the corresponding metadata may be stored in a first portion of memory, and data with one or more signatures in the corresponding metadata may be stored in a second portion of memory. Further, as discussed, the TSGC 360 may only try and match one or more signatures to signatures in metadata with transaction elimination enabled. Accordingly, the TSGC 360 may only perform matching for metadata stored in the second portion of memory. In some aspects, the portions of memory may be statically or dynamically allocated. Different portions of memory may be allocated for holding different types of data and corresponding metadata (e.g., modem data, sensor data, multimedia data, etc.). Accordingly, the TSGC 360 of a EU 306 may be configured to only match data stored in the relevant portion of memory that holds data of the relevant type, which may reduce the number of signature to compare and match, thereby reducing latency.

In certain aspects, the metadata, in addition to including a signature corresponding to data, also includes a pointer (e.g., address) to the data itself stored in memory (e.g., physical memory 324). Further, the metadata may include information (e.g., a bit) of whether the corresponding stored data is duplicate data or not as further discussed herein. For example, the pointer and duplicate data information may be used to reduce write bus transactions to memory when the data with the same content is already stored in memory, as further discussed herein.

As discussed, in certain aspects, TSGC 360 is configured to receive transaction requests for the EU 306 to physical memory 324 and perform transaction elimination. For example, the EU 306 may have data to write to the physical memory 324. For a write transaction, the optional BWC/D component 352 may optionally apply a compression technique (e.g., tile based compression scheme for image data divided into tiles) to the data to write to the physical memory 324. The BWC/D component 352 may pass the compressed data to the TSGC 360. Alternatively, if the EU 306 does not include the BWC/D component 352, the TSGC 360 directly receives the uncompressed data.

The TSGC 360 then computes one or more signatures (e.g., a unique signature or a unique signature and one or more non-unique signatures) based on the data (e.g., compressed data or uncompressed data). The TSGC 360 component may then determine whether the same one or more signatures as generated for the data is stored in the buffer 365 and/or the physical memory 324 (e.g., anywhere in the buffer 365 and/or the physical memory 324 or in certain portions of the buffer 365 and/or the physical memory 324 as discussed), as in whether a matching one or more signatures is stored. As discussed, where the TSGC 360 utilizes multiple signatures, the TSGC 360 may determine whether corresponding signatures are stored in multiple stages and only if all stages match does the TSGC 360 determine that the same one or more signatures as generated for the data is stored in the buffer 365 and/or the physical memory 324.

In certain aspects, the TSGC 360 may have one or more timers for determining whether the same one or more signatures as generated for the data is stored in the buffer 365 and/or the physical memory 324. If the TSGC 360 does not find a match within a time period set by the timer, the TSGC 360 determines there is no matching signature stored. In some aspects, there may be separate timers for searching in the buffer 365 and the physical memory 324. In some aspects, there may not be a timer associated with searching in the buffer 365 as the buffer 365 may be small and searching may not take much time. Accordingly, in some aspects, there may only be a timer associated with searching in physical memory 324. This may be due to physical memory 324 being large and searching all of physical memory 324 may add too much latency. In some aspects, there may be different timers associated with searching for non-unique signatures and searching for unique signatures. In some aspects, the time period(s) of the timer(s) may be pre-determined, or adjustable. Alternatively, instead of a timer, TSGC 360 may have one or more counters configured to count a number of items (e.g., addresses, metadata, etc.) searched instead of tracking a particular time period. For example, if the TSGC 360 does not find a match within a maximum number of counts, the TSGC 360 determines there is no matching signature stored. In other aspects, different methods may be used for limiting the searching for determining whether the same one or more signatures as generated for the data is stored in the buffer 365 and/or the physical memory 324 to less than the actual number of signatures stored.

If the TSGC 360 determines there is no matching signature, that means there is no data with the same content stored as for the write transaction. Accordingly, the TSGC 360 may store the data and metadata including the one or more signatures in physical memory 324 and buffer 365 as discussed. In some aspects, the metadata may further include a pointer to where the data is stored in physical memory 324. For example, the bus protocol conversion component 354 may be configured to include the pointer in the metadata (e.g., based on information received from the TSGC 360). The metadata may also include duplicate data information. For example, the bus protocol conversion component 354 may be configured to include the duplicate data information in the metadata (e.g., based on information received from the TSGC 360). In the present example, since the TSGC 360 did not find a match, the duplicate data information may indicate there is not duplicate data stored in physical memory 324.

If the TSGC 360 determines there is a matching signature, that means there is data with the same content stored in physical memory 324 and/or buffer 365 as for the write transaction. Accordingly, the TSGC 360 may instead of storing the same data again in the physical memory 324, include in the metadata a pointer to where the matching data is stored (e.g., the same address as in the metadata including the matching signature that points to the data with the same content). In some such aspects, the data has a fixed size (e.g., tile, chunk, page, etc.). Further, in certain aspects, the physical memory 324 may have portions in memory fully reserved for metadata, but not for storage of data. The TSGC 360 may further set the duplicate data information in the metadata to indicate that the data does correspond to duplicate data, meaning that multiple metadata include a pointer to the same stored data. The TSGC 360 may further cause the bus protocol conversion component 354 to send a bus transaction to update the duplicate data information of the metadata including the signature that was matched to by the TSGC 360.

In some aspects, the write transaction received by the TSGC 360 may be an update of data previously stored in physical memory 324. For example, TSGC 360 may be writing over data that is referenced by some already stored metadata. However, multiple metadatas may reference that same data. Accordingly, if the TSGC 360 merely writes over the data referenced by the metadata, then the data would change for all the multiple metadatas, thereby corrupting the data corresponding to the other metadatas. Therefore, in certain aspects, the TSGC 360 determines if metadata is already stored for data to be written to physical memory 324 by reading the metadata from physical memory 324. The TSGC 360 further determines if the metadata has a duplicate data information set to indicate that there are multiple metadata that point to the same data. If the metadata does not indicate that the data is duplicate data, the TSGC 360 performs the write transaction normally by updating the already stored data. However, if the metadata does indicate that the data is duplicate data, the TSGC 360 may instead write the data to a new location in physical memory 324 and set a pointer in the metadata corresponding to the data to point to the new location. Further, the duplicate data flag may be set to indicate no duplicate data in the metadata. Accordingly, the data stored in the physical memory 324 and referenced by other metadatas is not changed.

If the TSGC 360 receives a read transaction request, the TSGC 360 retrieves the metadata for the read transaction from the physical memory 324 or buffer 365 and performs the multiple stage signature matching procedure with respect to the buffer 365. If no matching signature is found in buffer 365, the TSGC 360 reads the data from the physical memory 324 from the location specified in the metadata. In some aspects, similar to the write transaction, one or more timers or counters are utilized to perform the multiple stage signature matching. In some aspects, for the read transaction, no timers or counters are utilized.

Figure 6:
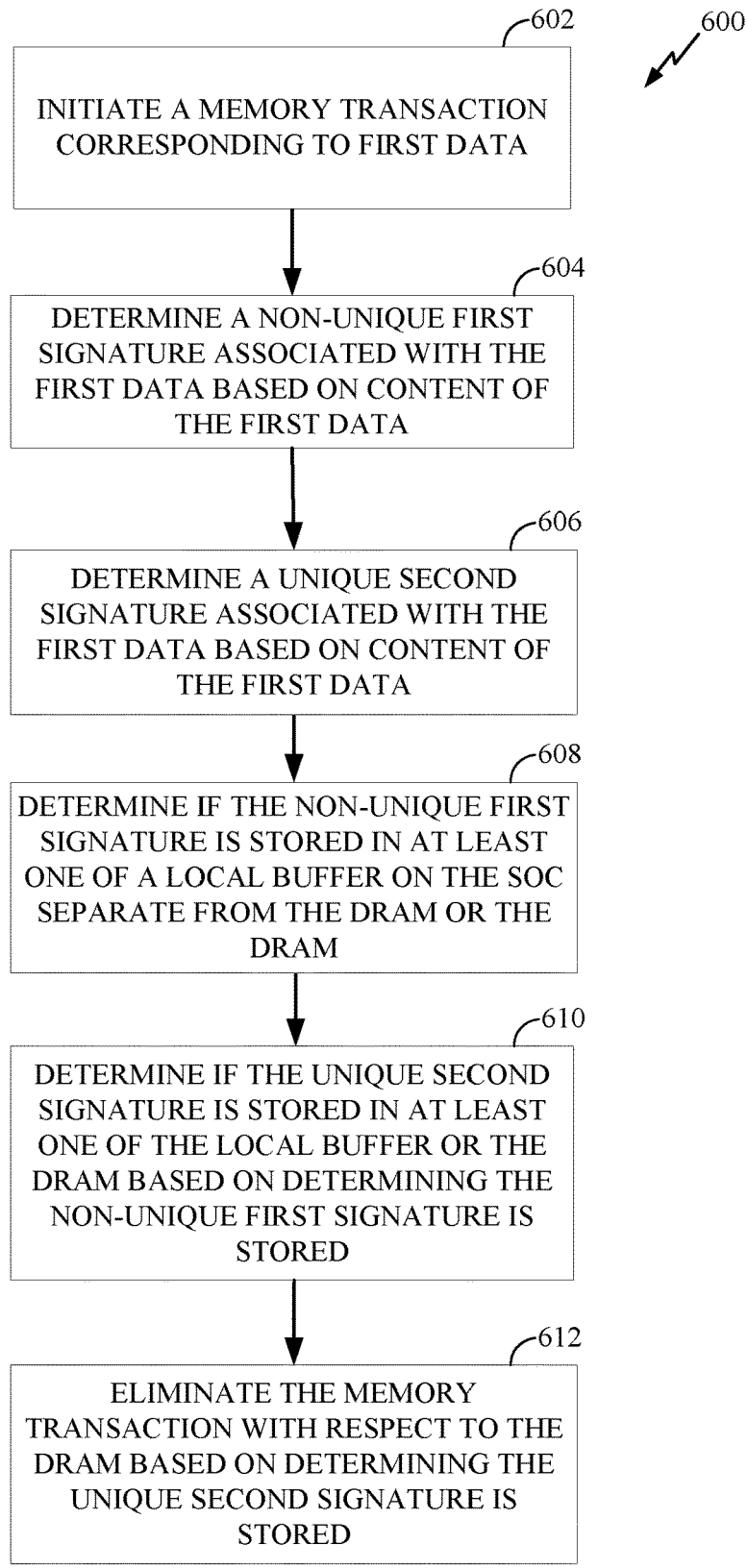
FIG. 6 illustrates example operations for communicating data between an electronic unit (EU) (e.g., of a system-on-chip (SoC)) and a physical memory, in accordance with certain aspects of the present disclosure.

FIG. 6 illustrates example operations 600 for communicating data between an electronic unit (EU) (e.g., of a system-on-chip (SoC)) and a physical memory, in accordance with certain aspects of the present disclosure.

At 602, an EU 306 initiates a memory transaction (e.g., a read or a write transaction) corresponding to first data. At 604, the EU 306 determines (e.g., generates or retrieves) a non-unique first signature associated with the first data based on content of the first data. At 606, the EU 306 determines a unique second signature (e.g., generates or retrieves) associated with the first data based on content of the first data. At 608, the EU 306 determines if the non-unique first signature is stored in at least one of a local buffer on the SoC separate from the DRAM or the DRAM. At 610, the EU 306 determines if the unique second signature is stored in at least one of the local buffer or the DRAM based on determining the non-unique first signature is stored. At 612, the EU 306 eliminates the memory transaction with respect to the DRAM based on determining the unique second signature is stored.

Figure 7:
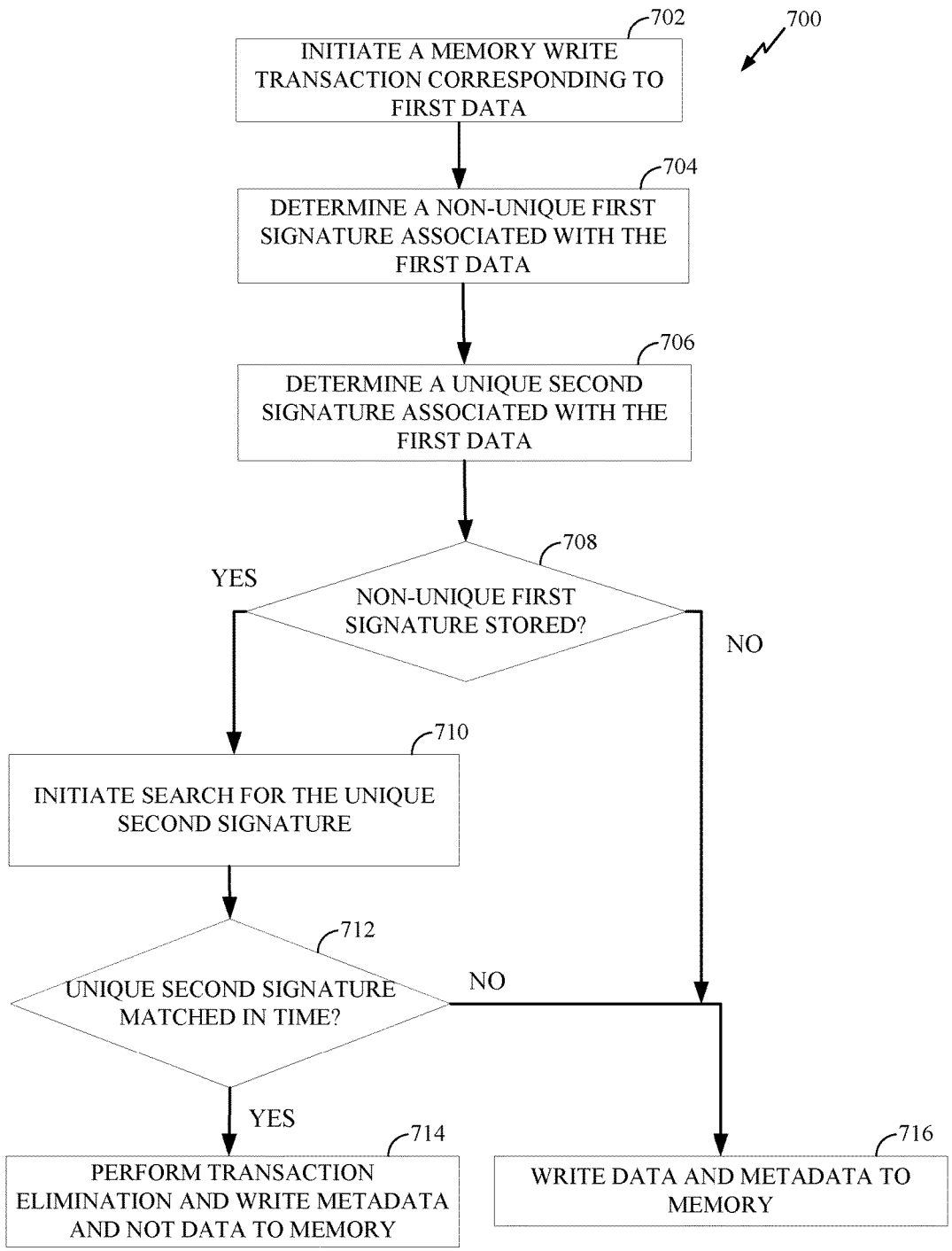
FIG. 7 illustrates example operations for communicating write data between an electronic unit (EU) (e.g., of a system-on-chip (SoC)) and a physical memory, in accordance with certain aspects of the present disclosure.

FIG. 7 illustrates example operations 700 for communicating write data between an electronic unit (EU) (e.g., of a system-on-chip (SoC)) and a physical memory, in accordance with certain aspects of the present disclosure.

At 702, an EU 306 initiates a memory write transaction corresponding to first data. At 704, the EU 306 determines a non-unique first signature associated with the first data based on content of the first data. At 706, the EU 306 determines a unique second signature associated with the first data based on content of the first data.

At 708, the EU 306 searches at least one of the local buffer on the SoC separate from the DRAM or the DRAM to determine if one or more instances of the non-unique first signature are stored. In some aspects, the EU 306 searches the entire local buffer (e.g., relevant portions of the local buffer configured to store non-unique signatures) and/or the entire DRAM (e.g., relevant portions of the DRAM configured to store non-unique signature). In some aspects, the EU 306 utilizes at least one timer or counter, as discussed, to search the local buffer and/or the DRAM and only searches until the at least one timer or counter reaches a threshold. If at 708 the EU 306 determines one or more non-unique first signatures are not stored (either after searching the entire buffer and/or DRAM, or after at least one timer or counter reaches a threshold), the operations 700 continue to 716. If at 708 the EU 306 determines one or more non-unique first signatures are stored (either after searching the entire buffer and/or DRAM, or after at least one timer or counter reaches a threshold), the operations 700 continue to 710.

At 710, the EU 306 initiates a search in the at least one of a local buffer on the SoC separate from the DRAM or the DRAM to determine if an instance of the unique second signature is stored. In some aspects, the EU 306 searches only the portions of the at least one of the local buffer on the SoC separate from the DRAM or the DRAM that include unique second signatures corresponding to (e.g., part of the same metadata as) the one or more non-unique first signatures found at 708. In some aspects, the EU 306 utilizes at least one timer or counter, as discussed, to search the local buffer and/or the DRAM and only searches until the at least one timer or counter reaches a threshold. At 712, the EU 306 continues the search for the instance of the unique second signature until the first of an instance of the unique second signature is found stored or the at least one timer or counter reaches a threshold without finding the unique second signature stored. If at 712, the at least one timer or counter reaches a threshold without finding the unique second signature stored, the operations 700 continue to 716. If at 712, the EU 306 finds an instance of the unique second signature stored, the operations 700 continue to 714 when the instance of the unique second signature is found (e.g., before the at least one timer or counter reaches the threshold). At 714, the EU 306 eliminates the memory transaction with respect to the data to the DRAM and only writes the metadata to the DRAM. At 716, the EU 306 writes both the data and the metadata to the DRAM.

Figure 8:
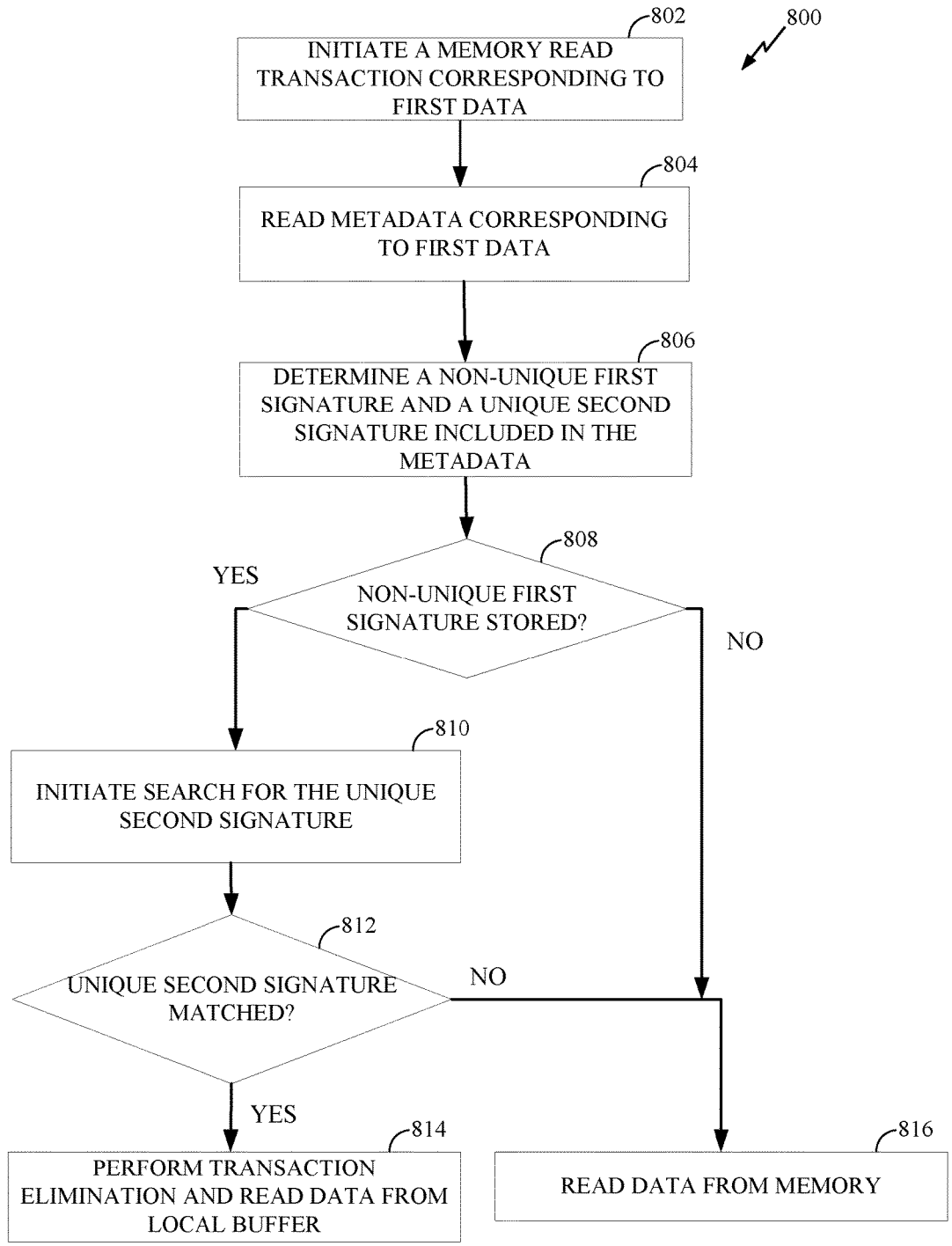
FIG. 8 illustrates example operations for communicating read data between an electronic unit (EU) (e.g., of a system-on-chip (SoC)) and a physical memory, in accordance with certain aspects of the present disclosure.

FIG. 8 illustrates example operations 800 for communicating read data between an electronic unit (EU) (e.g., of a system-on-chip (SoC)) and a physical memory, in accordance with certain aspects of the present disclosure.

At 802, an EU 306 initiates a memory read transaction corresponding to first data. At 804, the EU 306 reads metadata (e.g., from DRAM) corresponding to the first data. At 806, the EU 306 determines a non-unique first signature associated with the first data and a unique second signature associated with the first data based on the metadata including the non-unique first signature and the unique second signature.

At 808, the EU 306 searches the local buffer on the SoC separate from the DRAM to determine if one or more instances of the non-unique first signature are stored. In some aspects, the EU 306 searches the entire local buffer (e.g., relevant portions of the local buffer configured to store non-unique signatures). If at 808 the EU 306 determines one or more non-unique first signatures are not stored (e.g., after searching the entire buffer), the operations 800 continue to 816. If at 808 the EU 306 determines one or more non-unique first signatures are stored (e.g., after searching the entire buffer), the operations 800 continue to 810.

At 810, the EU 306 initiates a search in the local buffer on the SoC separate from the DRAM to determine if an instance of the unique second signature is stored. In some aspects, the EU 306 searches only the portions of the local buffer on the SoC separate from the DRAM that include unique second signatures corresponding to (e.g., part of the same metadata as) the one or more non-unique first signatures found at 808. At 812, the EU 306 continues the search for the instance of the unique second signature until the first of an instance of the unique second signature is found stored or the portions of the local buffer that include unique second signatures corresponding to the one or more non-unique first signatures found at 808 are all searched. If at 812, all the relevant portions of the local buffer are searched and an instance of the unique second is not found, the operations 800 continue to 816. If at 812, the EU 306 finds an instance of the unique second signature stored, the operations 800 continue to 814 when the instance of the unique second signature is found (e.g., before all the relevant portions of the local buffer are searched). At 814, the EU 306 eliminates the memory transaction with respect to the data to the DRAM and reads the data from the local buffer corresponding to the matched instance of the unique second signature. At 816, the EU 306 reads the data from the DRAM at the data address indicated in the metadata as corresponding to the first data.

In some configurations, the term(s) 'communicate,' 'communicating,' and/or 'communication' may refer to 'receive,' 'receiving,' 'reception,' and/or other related or suitable aspects without necessarily deviating from the scope of the present disclosure. In some configurations, the term(s) 'communicate,' 'communicating,' 'communication,' may refer to 'transmit,' 'transmitting,' 'transmission,' and/or other related or suitable aspects without necessarily deviating from the scope of the present disclosure.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features and/or functions illustrated herein may be rearranged and/or combined into a single component, step, feature or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

These apparatus and methods described in the detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, firmware, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, or combinations thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, PCM (phase change memory), flash memory, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

What is claimed is:

1. A method of communicating data between an electronic unit (EU) of a system-on-chip (SoC) and a dynamic random access memory (DRAM), the method comprising:
    initiating a memory transaction corresponding to first data;
    determining a non-unique first signature associated with the first data based on content of the first data;
    determining a unique second signature associated with the first data based on content of the first data;
    determining if the non-unique first signature is stored in at least one of a local buffer on the SoC separate from the DRAM or the DRAM;
    determining if the unique second signature is stored in at least one of the local buffer or the DRAM based on determining the non-unique first signature is stored; and
    eliminating the memory transaction with respect to the DRAM based on determining the unique second signature is stored.

2. The method of claim 1, wherein the non-unique first signature is shorter than the unique second signature.

3. The method of claim 1, wherein the memory transaction comprises a write transaction, and further comprising generating metadata comprising the non-unique first signature, the unique second signature, and an address associated with the stored unique second signature.

4. The method of claim 3, wherein the address corresponds to a location in the DRAM that stores data with a same content as the first data.

5. The method of claim 3, wherein the metadata further comprises a flag indicating whether the address is included in more than one metadata.

6. The method of claim 5, further comprising:
    receiving a second write transaction to update the first data corresponding to the write transaction;

determining the flag indicates the address is included in more than one metadata;
writing the update to the first data to the DRAM at a second address different than the address; and
generating metadata comprising the second address.

7. The method of claim 1, wherein determining if the unique second signature is stored is performed based on a timer.

8. The method of claim 1, wherein the memory transaction comprises a read transaction, wherein initiating the memory transaction corresponding to the first data comprises reading from the DRAM metadata associated with the first data, the metadata comprising the non-unique first signature and the unique second signature, wherein determining if the non-unique first signature is stored in at least one of a local buffer on the SoC separate from the DRAM or the DRAM comprises determining if the non-unique first signature is stored in the local buffer, wherein determining if the unique second signature is stored in at least one of the local buffer or the DRAM based on determining the non-unique first signature is stored comprises determining if the unique second signature is stored in the local buffer, and wherein eliminating the memory transaction comprises reading the first data from the local buffer and not the DRAM.

9. The method of claim 1, further comprising selectively enabling determining if the non-unique first signature is stored in at least one of the local buffer on the SoC separate from the DRAM or the DRAM based on at least one of a latency requirement or a history of redundancy of transactions.

10. The method of claim 1, further comprising storing data with associated signatures in a first portion of the DRAM, and storing data without associated signatures in a second portion of the DRAM, wherein determining if the non-unique first signature is stored in at least one of the local buffer on the SoC separate from the DRAM or the DRAM comprises accessing the first portion of the DRAM and not the second portion of the DRAM.

11. The method of claim 1, further comprising storing metadata in the DRAM, the metadata comprising the non-unique first signature, the unique second signature, and a flag indicating that the metadata includes signature data.

12. A system-on-chip (SoC), comprising:
a local buffer; and
an electronic unit configured to access the local buffer, the electronic unit being configured to:
  initiate a memory transaction corresponding to first data;
  determine a non-unique first signature associated with the first data based on content of the first data;
  determine a unique second signature associated with the first data based on content of the first data;
  determine if the non-unique first signature is stored in at least one of the local buffer on the SoC separate from a dynamic random access memory (DRAM) or the DRAM;
  determine if the unique second signature is stored in at least one of the local buffer or the DRAM based on determining the non-unique first signature is stored; and
  eliminate the memory transaction with respect to the DRAM based on determining the unique second signature is stored.

13. The SoC of claim 12, wherein the non-unique first signature is shorter than the unique second signature.

14. The SoC of claim 12, wherein the memory transaction comprises a write transaction, and wherein the electronic unit is further configured to generate metadata comprising the non-unique first signature, the unique second signature, and an address associated with the stored unique second signature.

15. The SoC of claim 14, wherein the address corresponds to a location in the DRAM that stores data with a same content as the first data.

16. The SoC of claim 14, wherein the metadata further comprises a flag indicating whether the address is included in more than one metadata.

17. The SoC of claim 16, wherein the electronic unit is further configured to:
  receive a second write transaction to update the first data corresponding to the write transaction;
  determine the flag indicates the address is included in more than one metadata;
  write the update to the first data to the DRAM at a second address different than the address; and
  generate metadata comprising the second address.

18. The SoC of claim 12, wherein determining if the unique second signature is stored is performed based on a timer.

19. The SoC of claim 12, wherein the memory transaction comprises a read transaction, wherein initiating the memory transaction corresponding to the first data comprises reading from the DRAM metadata associated with the first data, the metadata comprising the non-unique first signature and the unique second signature, wherein determining if the non-unique first signature is stored in at least one of a local buffer on the SoC separate from the DRAM or the DRAM comprises determining if the non-unique first signature is stored in the local buffer, wherein determining if the unique second signature is stored in at least one of the local buffer or the DRAM based on determining the non-unique first signature is stored comprises determining if the unique second signature is stored in the local buffer, and wherein eliminating the memory transaction comprises reading the first data from the local buffer and not the DRAM.

20. The SoC of claim 12, wherein the electronic unit is further configured to selectively enable determining if the non-unique first signature is stored in at least one of the local buffer on the SoC separate from the DRAM or the DRAM based on at least one of a latency requirement or a history of redundancy of transactions.

21. The SoC of claim 12, wherein the electronic unit is further configured to store data with associated signatures in a first portion of the DRAM, and store data without associated signatures in a second portion of the DRAM, wherein determining if the non-unique first signature is stored in at least one of the local buffer on the SoC separate from the DRAM or the DRAM comprises accessing the first portion of the DRAM and not the second portion of the DRAM.

22. The SoC of claim 12, wherein the electronic unit is further configured to store metadata in the DRAM, the metadata comprising the non-unique first signature, the unique second signature, and a flag indicating that the metadata includes signature data.

23. A system-on-chip (SoC), comprising:
means for initiating a memory transaction corresponding to first data;
means for determining a non-unique first signature associated with the first data based on content of the first data;
means for determining a unique second signature associated with the first data based on content of the first data;

means for determining if the non-unique first signature is stored in at least one of a local buffer on the SoC separate from a dynamic random access memory (DRAM) or the DRAM;

means for determining if the unique second signature is stored in at least one of the local buffer or the DRAM based on determining the non-unique first signature is stored; and means for eliminating the memory transaction with respect to the DRAM based on determining the unique second signature is stored.

24. The SoC of claim 23, wherein the non-unique first signature is shorter than the unique second signature.

25. The SoC of claim 23, wherein the memory transaction comprises a write transaction, and further comprising generating metadata comprising the non-unique first signature, the unique second signature, and an address associated with the stored unique second signature.

26. The SoC of claim 25, wherein the address corresponds to a location in the DRAM that stores data with a same content as the first data.

27. A non-transitory computer-readable medium that when executed by at least one processor causes the at least one processor to perform a method of communicating data between an electronic unit (EU) of a system-on-chip (SoC) and a dynamic random access memory (DRAM), the method comprising:

initiating a memory transaction corresponding to first data;

determining a non-unique first signature associated with the first data based on content of the first data;

determining a unique second signature associated with the first data based on content of the first data;

determining if the non-unique first signature is stored in at least one of a local buffer on the SoC separate from the DRAM or the DRAM;

determining if the unique second signature is stored in at least one of the local buffer or the DRAM based on determining the non-unique first signature is stored; and eliminating the memory transaction with respect to the DRAM based on determining the unique second signature is stored.

28. The computer-readable medium of claim 27, wherein the non-unique first signature is shorter than the unique second signature.

29. The computer-readable medium of claim 27, wherein the memory transaction comprises a write transaction, and further comprising generating metadata comprising the non-unique first signature, the unique second signature, and an address associated with the stored unique second signature.

30. The computer-readable medium of claim 29, wherein the address corresponds to a location in the DRAM that stores data with a same content as the first data.

* * * * *